US006194931B1

(12) United States Patent
Hwang

(10) Patent No.: US 6,194,931 B1
(45) Date of Patent: Feb. 27, 2001

(54) CIRCUIT FOR GENERATING BACKBIAS VOLTAGE CORRESPONDING TO FREQUENCY AND METHOD THEREOF FOR USE IN SEMICONDUCTOR MEMORY DEVICE

(75) Inventor: Hong-sun Hwang, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/295,602

(22) Filed: Apr. 22, 1999

(30) Foreign Application Priority Data

Apr. 24, 1998 (KR) .................................................. 98-14757

(51) Int. Cl.[7] ...................................................... H03L 7/06
(52) U.S. Cl. ......................... 327/157; 327/159; 331/1 A; 331/17; 331/40; 331/41
(58) Field of Search ..................................... 327/157, 159, 327/536; 331/1 A, 17, 25, 114, 40, 41; 363/59, 60; 307/110

(56) References Cited

U.S. PATENT DOCUMENTS

| | | | |
|---|---|---|---|
| 4,322,643 | * 3/1982 | Preslar ....................................... 327/5 |
| 4,455,628 | 6/1984 | Ozaki et al. ........................... 365/226 |
| 5,157,278 | 10/1992 | Min et al. .............................. 327/534 |
| 5,534,821 | * 7/1996 | Akiyama et al. ..................... 327/157 |
| 5,740,213 | * 4/1998 | Dreyer .................................. 327/157 |
| 5,821,789 | * 10/1998 | Lee ....................................... 327/157 |
| 5,870,003 | * 2/1999 | Boerster ................................ 327/157 |

* cited by examiner

*Primary Examiner*—Timothy P. Callahan
*Assistant Examiner*—An T. Liu
(74) *Attorney, Agent, or Firm*—Howrey Simon Arnold & White LLP

(57) ABSTRACT

Backbias voltage generation circuit corresponding to the frequency of a chip control signal is disclosed. The circuit includes a normal driving unit, an active driving unit and a level detecting unit. The level detecting unit detects whether a backbias voltage VBB is equal to or higher than a target voltage level. A normal control signal DETN is activated to enable the normal driving unit, and an active control signal DETA is activated to enable the active driving unit. The normal driving unit pumps down the backbias voltage VBB independent of the chip control signal CONC. The active driving unit includes a counter circuit and an active pumping unit. The counter circuit generates first and second edge detecting signals FED and RED in response to an activating edge of the chip control signal CONC. The active pumping unit pumps down the backbias voltage VBB, when the first edge signal FED or second edge signal RED is activated.

8 Claims, 4 Drawing Sheets

CIRCUIT FOR GENERATING BACKBIAS VOLTAGE CORRESPONDING TO FREQUENCY AND METHOD THEREOF FOR USE IN SEMICONDUCTOR MEMORY DEVICE

BACKGROUND OF THE INVENTION

1. Field of the Invention

The present invention relates to a semiconductor memory device, and more particularly, to a backbias voltage (VBB) generation circuit and a method of generating backbias voltage corresponding to the high frequency in a semiconductor memory device.

2. Description of the Related Art

In a semiconductor memory device, a backbias voltage is a voltage lower than an external minimum voltage and is used for the following benefits:

First, the backbias voltage VBB prevents a PN junction in a memory chip from being forward-biased, which would cause a loss of data in memory cells or latch-up phenomena. Even if the data signal applied to an input terminal does not meet the desired level, a PN diode does not turn on when a backbias voltage is applied. Thus, electrons of the input terminal are not injected into the P-well.

Second, the circuit operation is stabilized by reducing the threshold voltage fluctuation of a MOS transistor caused by the body effect. If a backbias voltage VBB is applied, the threshold voltage is less affected by the source potential change. Thus, a backbias voltage VBB reduces the variation in the threshold voltage and, in turn, can reduce the voltage applied to the wordline, which increases the reliability of a device.

Third, the backbias voltage VBB increases a threshold voltage of a parasitic MOS transistor. The increased threshold voltage of the parasitic MOS transistor reduces the concentration of a channel stop impurity under a field oxide layer, which reduces the possibility of junction breakdown and current leakage.

Fourth, the backbias voltage VBB reduces PN junction capacitance formed between an N$^+$ region (drain and source) of an NMOS and P-well, so that the semiconductor memory device circuit can operate at a higher speed. The reduction in the PN junction capacitance reduces the parasitic capacitance of bit line contact and increases the data flow transmitted to the bit line.

One type of backbias voltage generation circuit is disclosed in U.S. Pat. No. 5,157,278. The backbias voltage generation circuit of the U.S. Pat. No. 5,157,278, as shown in FIG. 1, detects a backbias voltage and then drives a self-oscillating circuit to thereby generate the backbias voltage. One pumping circuit operates regardless of whether the device is in a standby mode (in which a memory neither reads nor writes) or in an active mode (in which the memory reads or writes).

However, the backbias voltage generation circuit disclosed in U.S. Pat. No. 5,157,278 does not sufficiently compensate for a semiconductor device's substrate current generated while in an active mode. Instead, the backbias voltage generation circuit disclosed in the U.S. Pat. No. 5,157,278 employs a small capacity pump driver in order to minimize the current consumption in a standby mode.

A similar backbias voltage generation circuit disclosed in U.S. Pat. No. 4,455,628 and shown in FIG. 2, drives a pump driver by a self-oscillating circuit operating without a backbias voltage detecting circuit. The pump is driven when a row address strobe signal (/RAS) and a column address strobe signal (/CAS) are activated.

The prior art backbias voltage generation circuits disclosed in both U.S. Pat. Nos. 5,157,278 and 4,455,628 also enables the self-oscillating circuit and drives the pump driver by detecting the backbias voltage or the activation of /RAS and /CAS, which causes the pumping operation to last longer than the active period of each row. Thus, the pump driver does not have sufficient temporal margins between one pumping operation and the next pumping operation, which increases the backbias voltage fluctuation.

SUMMARY OF THE INVENTION

It is an objective of the present invention to provide a backbias voltage generation circuit and a method for reducing the backbias voltage fluctuation depending on the operational frequency of a semiconductor memory device.

Accordingly, to achieve the above objective of the present invention, there is provided a backbias voltage generator for a semiconductor memory device, comprising, at least one normal driving unit that pumps down the backbias voltage independent of the chip control signal indicating the activation of the semiconductor memory device, an active driving unit that pumps down the backbias voltage more greatly than the normal driving unit while the chip control signal is active, in response to the chip control signal, when the active control signal is detected, and a level detecting unit that generates a normal control signal and an active control signal activated when the backbias voltage is higher than the predetermined level. The active driving unit includes a counter that generates signals to enable at least two pump drivers alternately in response to the activating edge of said chip control signal.

Preferably, the active driving unit comprises, a counter circuit for providing first edge detecting signal and second edge detecting signal which transits its level alternately in response to the activating edge of the chip control signal, and an active pumping unit that pumps down the backbias voltage, when the first or second edge detecting signal is activated.

To achieve the above objective of the present invention, there is provided a method for generating a backbias voltage for a semiconductor memory device, having a normal driving unit that operates independent of a chip control signal indicating an activation of the semiconductor memory device and an active driving unit that operates in response to a chip control signal, comprising the steps of: (a) determining whether the backbias voltage is equal to or higher than the predetermined level; (b) determining whether the semiconductor memory device is activated or not; (c) driving the normal driving unit to pump down the backbias voltage when the backbias voltage is equal to or higher than the target level in step (a); and (d) driving the active driving unit to pump down the backbias voltage in response to the activation edge of a row activation signal indicating the activation of the semiconductor memory device in step (b), when the backbias voltage is equal to or higher than the target level in step (a).

According to the circuit and method of the present invention, the semiconductor memory device pumps down the backbias voltage corresponding to every activating edge of the chip control signal to thereby minimize the backbias voltage variation in an active mode.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENT

The present invention now will be described fully with reference to the accompanying drawings, in which preferred embodiments of the invention are shown.

Figure 1:
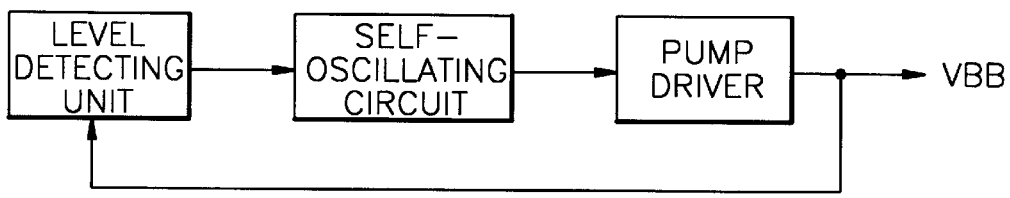
FIG. 1 is a diagram of a backbias voltage generation circuit having a conventional level detection unit.
Figure 2:
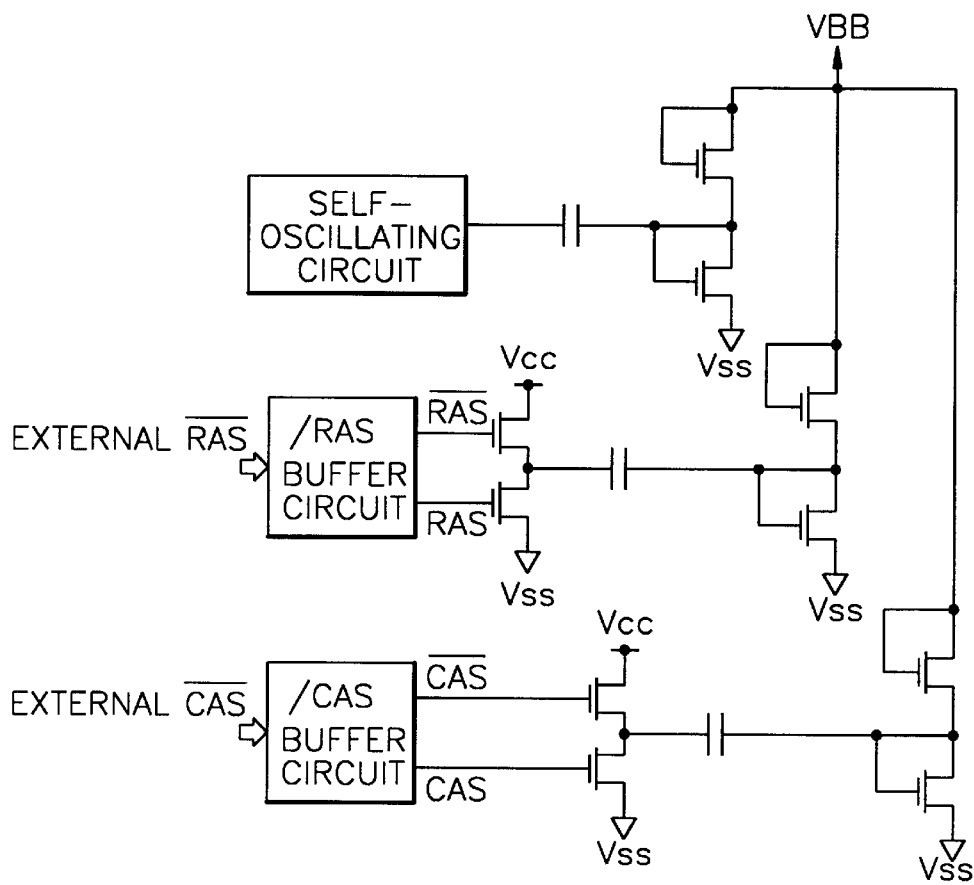
FIG. 2 is a diagram of a backbias voltage generation circuit driven in response to a conventional external control signal.
Figure 3:
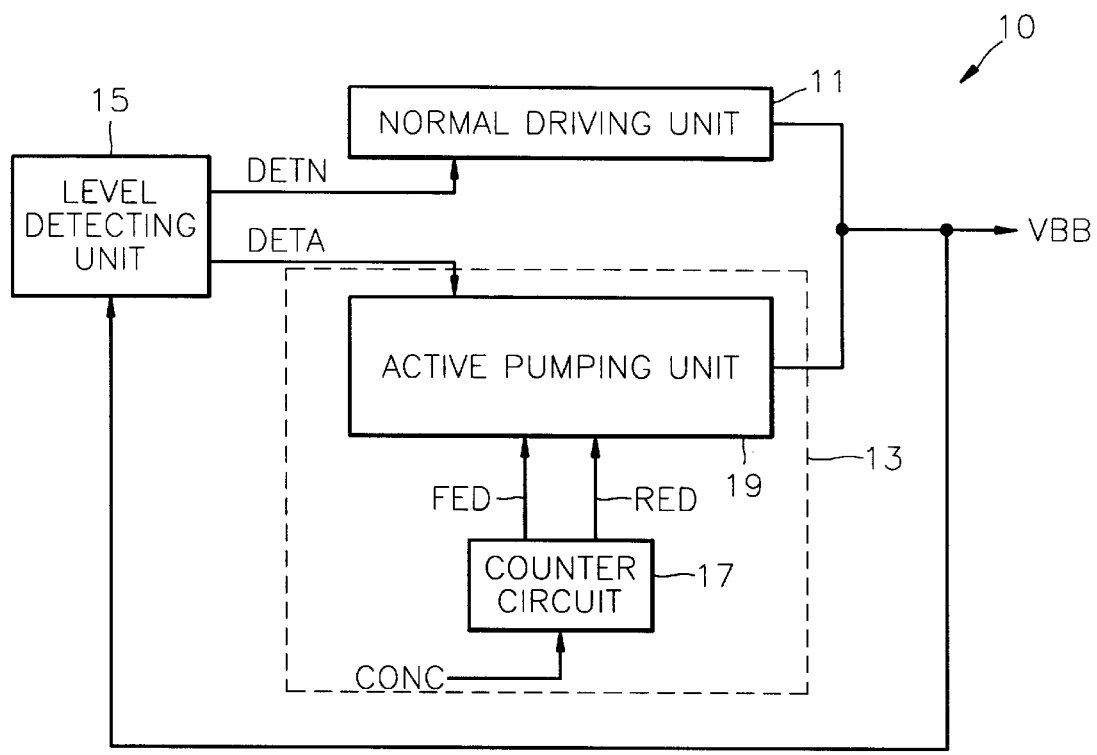
FIG. 3 is a schematic view showing an embodiment of a backbias voltage generation circuit that corresponds to the frequency of the chip control signal according to the present invention.

Referring to FIG. 3, a circuit 10 for generating a backbias voltage in response to the backbias voltage level and chip control signal according to the present invention includes a normal driving unit 11, an active driving unit 13 and a level detecting unit 15.

The level detecting unit 15 detects whether the backbias voltage VBB is higher than a predetermined target voltage level. When the backbias voltage VBB is higher than the target voltage level TVBB (see FIG. 7), the level detecting unit 15 generates a normal control signal DETN and an active control signal DETA. The normal control signal DETN activates the normal driving unit 11, and the active control signal DETA activates the active driving unit 13.

In the preferred embodiment, the normal control signal DETN and the active control signal DETA may be the same signal.

When the normal control signal DETN is activated, i.e., the backbias voltage VBB is higher than the target voltage level TVBB, the normal driving unit 11 pumps down the backbias voltage VBB.

The normal driving unit 11 pumps down the backbias voltage regardless of the chip control signal CONC which indicates that the semiconductor memory device is active.

In the present embodiment, row address strobe (/RAS), column address strobe (/CAS) or a chip select signal (/CS) of a semiconductor memory device can be used as the chip control signal CONC.

Once the active control signal DETA is activated, the active driving unit 13 is activated by the chip control signal CONC. The active driving unit 13 pumps down the backbias voltage at least twice while the chip control signal is active.

The active driving unit 13 includes a counter circuit 17 and an active pumping unit 19.

The counter circuit 17 generates a first edge detecting signal FED and a second edge detecting signal RED, in response to the activating edge of the chip control signal CONC. The first edge detecting signal FED and the second edge detecting signal RED alternately transit its level. The first edge detecting signal FED or the second edge detecting signal RED activates the active pumping unit 19 to pump down the backbias voltage VBB.

Figure 4:
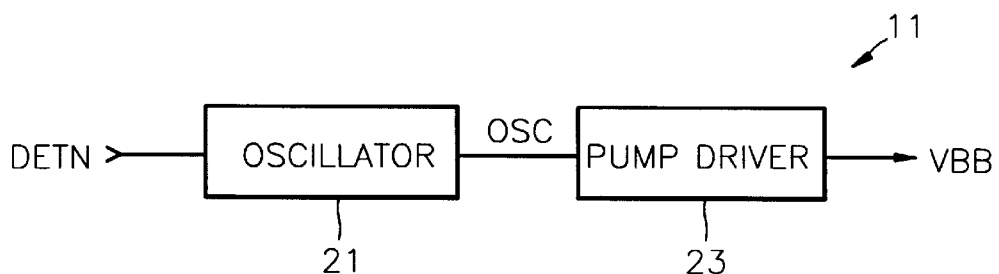
FIG. 4 is a diagram of the normal driving unit 11 of FIG. 3.

Referring to FIG. 4, the normal driving unit 11 includes an oscillator 21 and a pump driver 23.

The normal control signal DETN activates the oscillator 21 to generate an oscillation signal OSC, which oscillates periodically. The pump driver 23 pumps down the backbias voltage VBB in response to the oscillation signal OSC.

Figure 5:
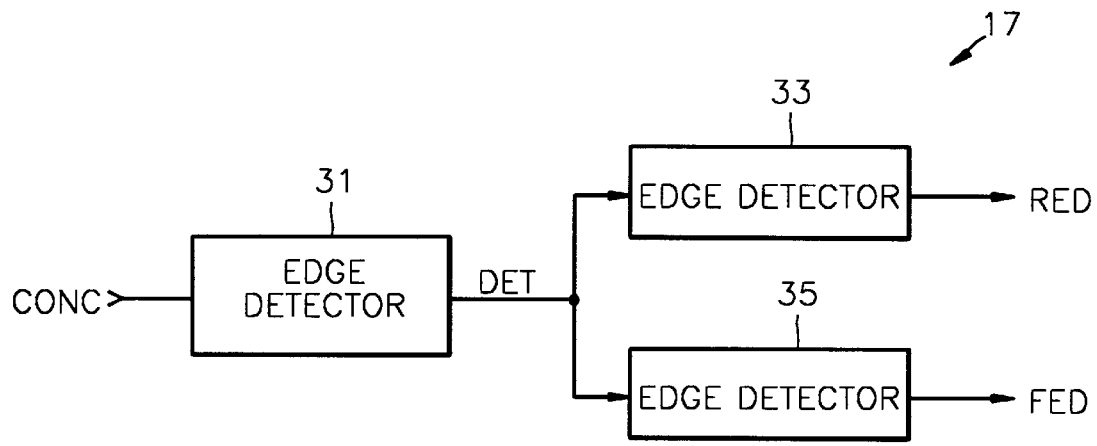
FIG. 5 is a diagram of the counter circuit 17 of FIG. 3.

Referring to FIG. 5, the counter circuit 17 includes first, second and third edge detectors 31, 33 and 35.

The first edge detector 31 generates an activation detecting signal DET alternately performing level transition in response to a falling edge of the chip control signal CONC.

The second edge detector 33 generates a rising edge detecting signal RED in response to a rising edge of the activation detecting signal DET, and the third edge detector 35 generates a falling edge detecting signal FED in response to the falling edge of the activation detecting signal DET.

Figure 6:
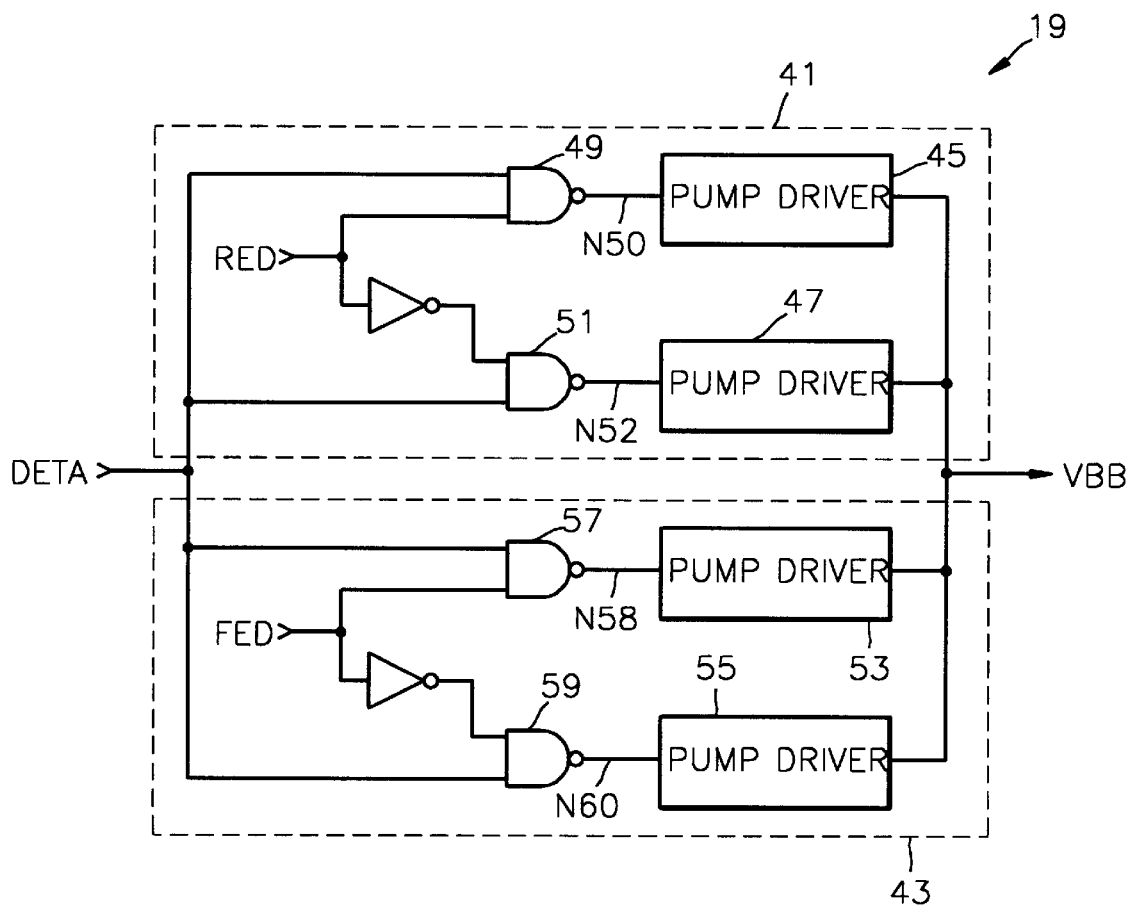
FIG. 6 is a diagram of the active pumping unit 19 of FIG. 3.

Referring to FIG. 6, the active pumping unit 19 includes a first pumping unit 41 and a second pumping unit 43.

When the active control signal DETA is activated to high, i.e., the backbias voltage VBB is higher than a target voltage TVBB, the first pumping unit 41 pumps down the backbias voltage VBB in response to the level transition of the rising edge detecting signal RED from high to low (or low to high).

Also, when the active control signal DETA is activated to high, i.e., the backbias voltage VBB is higher than the target voltage TVBB, the second pumping unit 43 pumps down the backbias voltage VBB in response to the level transition of the falling edge detecting signal FED from high to low (or low to high).

The first pumping unit 41 includes pump drivers 45 and 47.

Figure 7:
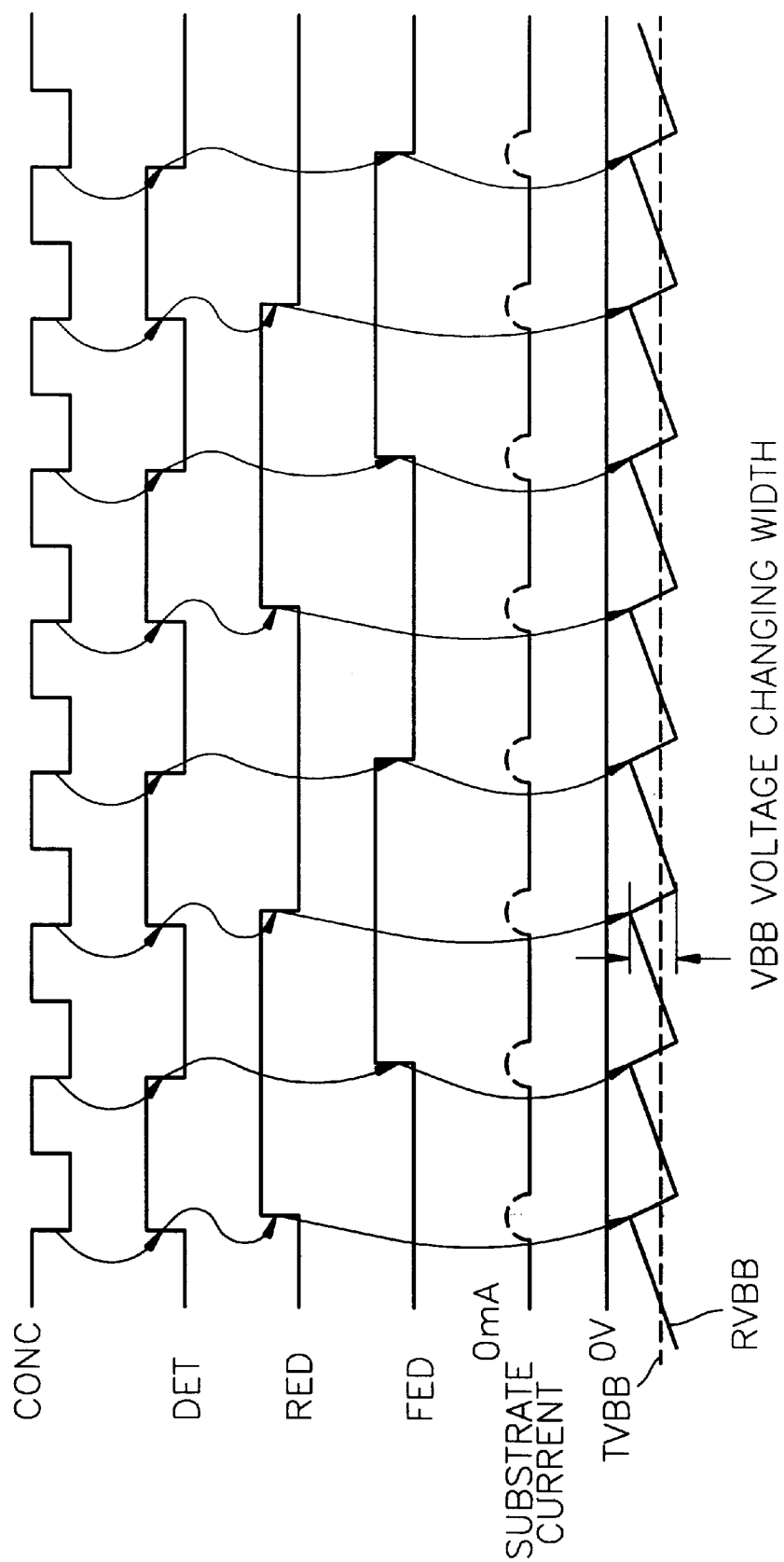
FIG. 7 is a timing diagram of a main terminal according to the present invention.

Referring to FIGS. 6 and 7, when the rising edge detecting signal RED rises from low to high, the output signal N50 of the NAND gate 49 falls from high to low, which drives the pump driver 45 to pump down the backbias voltage VBB.

Also, when the rising edge detecting signal RED falls from high to low, the output signal N52 of the NAND gate 51 falls from high to low, which drives the pump driver 47 to pump down the backbias voltage VBB.

The second pumping unit 43 includes pump drivers 53 and 55.

Referring to FIGS. 6 and 7, the falling edge detecting signal FED rises from low to high, the output signal N58 of the NAND gate N57 falls from high to low, which drives the pump driver 53 to pump down the backbias voltage VBB.

Also, when the falling edge detecting signal FED falls from high to low, the output signal N60 of the NAND gate 59 falls from high to low, which drives the pump driver 55 to pump down the backbias voltage.

Referring to FIG. 7, the operation of a frequency corresponding backbias voltage generation circuit of the present invention is described as follows: whenever the chip control signal CONC falls from high to low, one of pump drivers 45, 47, 53 and 55 pumps down the backbias voltage VBB.

Accordingly, the pump drivers 45, 47, 53 and 55 operate in every activation period of CONC respectively, so that each of the pump drivers 45, 47, 53 and 55 is ensured to have a sufficient temporal margin between one pumping operation and the next pumping operation.

The structure and operational effect of a pump driver in FIGS. 4 and 6 are well-known to a skilled person in the art.

This invention may, however, be embodied in many different forms and should not be construed as limited to the embodiment set forth herein. Rather, these embodiments are provided so that this disclosure will be thorough and complete, and will fully convey the scope of the invention to those skilled in the art.

What is claimed is:

1. A backbias voltage generation circuit, comprising:

a normal driving unit that pumps a backbias voltage;

an active driving unit that pumps the backbias voltage; and a backbias voltage level detecting unit that activates said normal driving unit and said active driving unit, wherein said normal driving unit is activated as long as said backbias voltage level detecting unit detects that the backbias voltage level maintains a predetermined level; and wherein said active driving unit is activated when said backbias voltage level detecting unit detects that the backbias voltage level maintains the predetermined level and a device to which said backbias voltage generation circuit provides the backbias voltage is activated in response to an activation signal.

2. A backbias voltage generation circuit as recited in claim 1, wherein said normal driving unit comprises:

an oscillator that generates oscillation signals when said normal driving unit is activated; and a pump driver that is activated in response to the oscillation signals; and wherein said active driving unit comprises:

a counter circuit that generates a first edge detecting signal and a second edge detecting signal, the first edge detecting signal and the second edge detecting signal generating alternative levels of signals in response to an activating edge of the activation signal; and an active pumping unit that is activated by at least one of the first edge detecting signal and the second edge detecting signal.

3. A backbias voltage generation circuit as recited in claim 2, wherein said counter circuit comprises:

a first edge detector generating an activation detecting signal that transmits alternate levels of signals in response to a falling edge of the activation signal;

a second edge detector generating a rising edge detecting signal in response to a rising edge of the activation detecting signal; and a third edge detector generating a falling edge detecting signal in response to a falling edge of the activation detecting signal; and wherein said active pumping unit comprises a first pumping unit and a second pumping unit, wherein, when said active driving unit is activated, the first pumping unit is activated in response to the level transition of the rising edge detecting signal; and the second pumping unit is activated in response to the level transition of the falling edge detecting signal.

4. A backbias voltage generation circuit as recited in claim 3, wherein the first pumping unit comprises:

a first pump driver activated in response to a rising edge of the rising edge detecting signal; and a second pump driver activated in response to a falling edge of the rising edge detecting signal; and wherein the second pumping unit comprises:

a third pump driver that is activated in response to a rising edge of the falling edge detecting signal; and a fourth pump driver that is activated in response to a falling edge of the falling edge detecting signal.

5. A backbias voltage generation circuit as recited in claim 4, wherein said normal driving unit and said active driving unit are activated when said backbias voltage level detecting unit detects that the backbias voltage level is higher than the predetermined level.

6. A backbias voltage generation circuit as recited in claim 5, wherein said normal driving unit and said active driving unit are pumping down the backbias voltage level when activated by said backbias voltage level detecting unit.

7. A backbias voltage generation circuit as recited in claim 6, wherein said activation signal is one of the group consisting of a row address strobe, a column address strobe and a chip select signal.

8. A method for generating a backbias voltage for a semiconductor device, having a normal driving unit that is activated as long as the backbias voltage level is higher than a predetermined level and an active driving unit that is activated in response to an activation signal of the semiconductor device when the backbias voltage level is higher than the predetermined level comprising steps of:

determining whether the backbias voltage level is higher than the predetermined level;

determining whether the semiconductor device is active;

driving the normal driving unit to pump down the backbias voltage, when the backbias voltage level is higher than the predetermined level; and driving the active driving unit to pump down the backbias voltage in response to the activation signal of the semiconductor device, when the semiconductor device is active and the backbias voltage level is higher than the predetermined level.

* * * * *